(12) United States Patent
Yu et al.

(10) Patent No.: US 11,505,860 B2
(45) Date of Patent: Nov. 22, 2022

(54) FABRIC COLORING METHOD AND COLORED FABRIC

(71) Applicant: GUANGDONG RISING WELL SCIENCE & TECHNOLOGY CO., LTD., Kaiping Jiangmen (CN)

(72) Inventors: Rongzhan Yu, Kaiping Jiangmen (CN); Qiongxi Liu, Kaiping Jiangmen (CN); Xin Zhang, Kaiping Jiangmen (CN); Zhongyu Wang, Kaiping Jiangmen (CN)

(73) Assignee: GUANGDONG RISING WELL SCIENCE & TECHNOLOGY CO., LTD., Kaiping Jiangmen (CN)

( * ) Notice: Subject to any disclaimer, the term of this patent is extended or adjusted under 35 U.S.C. 154(b) by 0 days.

(21) Appl. No.: 17/131,159

(22) Filed: Dec. 22, 2020

(65) Prior Publication Data
US 2021/0108307 A1 Apr. 15, 2021

Related U.S. Application Data

(63) Continuation of application No. PCT/CN2019/091638, filed on Jun. 18, 2019.

(30) Foreign Application Priority Data
Jun. 22, 2018 (CN) .......................... 201810654518.5

(51) Int. Cl.
*C23C 14/35* (2006.01)
*C23C 14/14* (2006.01)
(Continued)

(52) U.S. Cl.
CPC .............. *C23C 14/35* (2013.01); *C23C 14/02* (2013.01); *C23C 14/022* (2013.01); *C23C 14/06* (2013.01);
(Continued)

(58) Field of Classification Search
CPC ..... C23C 14/02; C23C 14/022; C23C 14/024; C23C 14/35; C23C 14/205; C23C 14/58;
(Continued)

(56) References Cited

U.S. PATENT DOCUMENTS 4,927,683 A 5/1990 Tsutsui

FOREIGN PATENT DOCUMENTS

| CN | 1414168 A | 4/2003 |
| CN | 1970882 A | 5/2007 |

(Continued)

OTHER PUBLICATIONS

Machine Translation CN108130727A (Year: 2018).*
(Continued)

*Primary Examiner* — Michael A Band
(74) *Attorney, Agent, or Firm* — J.C. Patents

(57) ABSTRACT

The present application provides a fabric coloring method and a colored fabric, where the fabric coloring method includes: performing radiation drying on a base cloth; sequentially forming an adhesive layer and at least one color-generating layer on a surface of the base cloth after the radiation drying by vacuum deposition, where the adhesive layer contains at least one of Ti, Cr, Si and Ni, and a thickness of the adhesive layer ranges from 1 nm to 2000 nm; the color-generating layer contains at least one of Al, Ti, Cu, Fe, Mo, Zn, Ag, Au, and Mg, and the total thickness of the color-generating layer ranges from 1 nm to 4000 nm. The fabric coloring method can not only produce rich colors and make the colored fabric have good color fastness, but also reduce the sensitivity of color of the colored fabric to thickness of the film, thus improving the industrial operability.

8 Claims, 3 Drawing Sheets

(51) Int. Cl.
    C23C 14/02    (2006.01)
    C23C 14/06    (2006.01)
    C23C 14/20    (2006.01)
    C23C 14/58    (2006.01)
    C23C 14/08    (2006.01)
    C23C 14/10    (2006.01)
    D06M 11/83    (2006.01)
    D06M 10/00    (2006.01)
    D06P 1/673    (2006.01)

(52) U.S. Cl.
    CPC ........ *C23C 14/0641* (2013.01); *C23C 14/081* (2013.01); *C23C 14/083* (2013.01); *C23C 14/085* (2013.01); *C23C 14/086* (2013.01); *C23C 14/087* (2013.01); *C23C 14/10* (2013.01); *C23C 14/14* (2013.01); *C23C 14/205* (2013.01); *C23C 14/58* (2013.01); *D06M 10/003* (2013.01); *D06M 11/83* (2013.01); *D06P 1/673* (2013.01)

(58) Field of Classification Search
    CPC ... C23C 14/06; C23C 14/0641; C23C 14/081; C23C 14/083; C23C 14/085; C23C 14/086; C23C 14/087; C23C 14/10; C23C 14/14; D06M 11/83; D06M 10/003
    See application file for complete search history.

(56) References Cited

FOREIGN PATENT DOCUMENTS

| | | | |
|---|---|---|---|
| CN | 104727139 | A | 6/2015 |
| CN | 104831528 | A | 8/2015 |
| CN | 105316624 | A | 2/2016 |
| CN | 106592035 | A | 3/2017 |
| CN | 107142713 | A | 9/2017 |
| CN | 108103444 | A | 6/2018 |
| CN | 108118529 | A | 6/2018 |
| CN | 108130723 | A | 6/2018 |
| CN | 108130724 | A | 6/2018 |
| CN | 108130726 | A | 6/2018 |
| CN | 108130727 | A | 6/2018 |
| CN | 108130761 | A | 6/2018 |
| CN | 108149471 | A | 6/2018 |
| CN | 108149475 | A | 6/2018 |
| CN | 108166281 | A | 6/2018 |
| JP | S63152463 | A | 6/1988 |
| JP | H03161538 | A | 7/1991 |
| WO | WO2006058722 | A1 | 6/2006 |
| WO | WO-2018170899 | A1 * | 9/2018 ............. C23C 14/35 |

OTHER PUBLICATIONS

Machine Translation CN108130723A (Year: 2018).*
Fu, W.; Deng, J.; Li, X. "Microwave drying of fabrics". Journal of Microwave Power and Electromagentic Energy, 2019. vol. 53, No. 1, 12-23. (Year: 2018).*
International Search Report of PCT/CN2019/091638.
Extended European Search Report of EP19821942.0.
First Office Action of the parallel application KR10-2021-7002204.
"New prospects in pretreatment of cotton fabrics using microwave heating", Carbohydrate Polymers, 103 (2014) 385-391.

* cited by examiner

FABRIC COLORING METHOD AND COLORED FABRIC

CROSS-REFERENCE TO RELATED APPLICATIONS

This application is a continuation of International Application No. PCT/CN2019/091638, filed on Jun. 18, 2019, which claims priority to Chinese Patent Application No. 201810654518.5, filed on Jun. 22, 2018, both of which are hereby incorporated by reference in their entireties.

TECHNICAL FIELD

The present application relates to fabric coloring technology, in particular, to a fabric coloring method and a colored fabric.

BACKGROUND

In the existing color system, distinguishing according to the color generation principle, there are two main methods of color generation: pigment color and structural color. The pigment color mainly depends on chemical bonds in substance molecules; some electrons in chemical bonds are in a state where they can easily absorb visible light with specific wavelengths, while other wavelengths will be reflected to show different colors. The substance that can achieve this effect is pigment, and such color is called pigment color. The pigment color can be understood as an inherent performance of materials.

The structural color, also known as physical color, is due to the special structure of the object surface making light waves refract, diffuse reflect, diffract or interference, thereby changing the composition of light, increasing the light intensity of certain specific wavelengths in the spectrum, and weakening some, and finally making the object show different colors. The metallic luster and glitter on the integument of beetle are typical structural colors.

Traditional fabric coloring mainly depends on the pigment color, specifically chemical dye dyeing, which is mainly produced by applying dye to base cloth. At present, the dyeing and finishing process of the whole dyeing and finishing industry generally includes pretreatment, dyeing, printing and finishing. However, the traditional dyeing method has following obvious disadvantages:

1. The dyeing and finishing industry is a strictly controlled industry of the country. On average, 2 to 4 tons of water is consumed for dyeing every 100 meters of cloth, and the amount of waste water accounts for 60% to 80% of the total water consumption. At the same time, volatile pollutants are produced during the preparation and production of dyes.

2. The existing chemical dye dyeing mainly depends on the adsorption and fixation between dyeing groups and fabric fiber, and such process highly depends on the structure of fibers, so different fabric materials are required to be used together with different dyes and auxiliaries. For example, nylon fabrics are mainly dyed with acid dyes, acrylic fabrics are mainly dyed with cationic dyes or disperse dyes, and acetate fabrics are mainly dyed with disperse dyes and sometimes insoluble azo dyes, so the universality of pigments is poor.

3. Traditional dyeing mainly uses liquid dyes, and there are great differences in the degree of shrinkage and curling of fabrics with different weaving methods. Therefore, for fabrics with different weaving methods, equipments used for dyeing are also different.

In view of the above disadvantages of traditional chemical dyes dyeing, how to effectively construct structural colors on textile materials has become the focus of concern and research in textile dyeing and finishing industry. For example, the use of magnetron sputtering technology to perform radio frequency sputtering on the fabric substrate (base cloth) to form a periodic film of alternating $SiO_2$ and $TiO_2$ on the surface of the base cloth. Under the irradiation of light, colored fabrics will show bright and gorgeous colors. The coloring technology mainly utilizes the alternating periodic arrangement of low refractive index $SiO_2$ film and high refractive index $TiO_2$ film to cause light interference, so that the colored fabric presents bright and gorgeous colors.

The above coloring technology has no waste water discharge, thus avoiding the waste of water resources and environmental pollution; at the same time, it has wide adaptability to the base cloth, and the fibers of the base cloth can be natural protein fibers such as mulberry silk, and chemical fibers such as polyester and nylon. However, because this coloring technology only uses the periodic interference of titanium dioxide and silicon dioxide to realize color generation, the type of color finally presented is greatly limited; moreover, this coloring technology is extremely sensitive to the thickness of the film, and it is difficult to achieve the ideal yield in actual production, so there are great limitations in the industrial popularization of this coloring technology; in addition, the coloring technology cannot guarantee the color fastness of fabrics.

At present, there are also a small amount of literatures that report on the use of vacuum deposition technology to deposit other metal elementary substances or even alloys on the surface of the fiber to slightly increase the richness of colors. However, this method is limited to a few special fibers such as carbon fiber and polyimide, but it is not applicable to traditional fibers such as cotton and silk, which is mainly reflected in the uneven coloring of colored fabrics and the lack of film deposition in some areas, resulting in that color fastness cannot meet national standards.

Therefore, it is an urgent problem to be solved at present to develop a coloring method with good universality for fabric fibers, which can not only produce rich colors, but also make colored fabrics have very good color fastness and meet the requirements of industrial production.

SUMMARY

In view of the above disadvantages, the embodiments of the present disclosure provide a fabric coloring method, which can not only produce rich colors, but also improve the industrial operability because the sensitivity of colors to film thickness is reduced. At the same time, the coloring method has good universality for fibers, and can make colored fabrics have outstanding color fastness.

The embodiments of the present disclosure also provide a colored fabric prepared by the above-mentioned coloring method. The colored fabric can have rich colors and good color fastness, and can be prepared by an industrial method.

To achieve the above purpose, embodiments of the present disclosure provide a fabric coloring method, which includes following steps:

performing radiation drying treatment on a base cloth;

sequentially forming, by vacuum deposition, an adhesive layer and at least one color-generating layer on a surface of the base cloth after radiation drying, where:

a composition of the adhesive layer comprises at least one of Ti, Cr, Si and Ni, and a thickness of the adhesive layer ranges from 1 nm to 2000 nm;

a composition of the color-generating layer comprises at least one of Al, Ti, Cu, Fe, Mo, Zn, Ag, Au, and Mg, and a total thickness of the color-generating layer ranges from 1 nm to 4000 nm, preferably 4 nm to 2000 nm.

According to the coloring method provided by the embodiments of the present disclosure, vacuum deposition technology is applied to form a color-generating film layer including an adhesive layer and a color-producing layer on the surface of the base cloth, and the comprehensive effects of different materials and different thickness nano-films on light absorption, reflection and refraction are applied to make the resulting colored fabrics show different colors.

In addition, by changing the materials used for the adhesive layer and the color-generating layer, the thickness of each film layer and the setting method of the film layer, the color of the colored fabric will change accordingly, which gives the colored fabric richer colors and even more color possibilities. Therefore, according to the required fabric color, at least one of the above factors can be properly adjusted and set, thus greatly reducing the dependence of the fabric color on the film thickness, which is conducive to the industrialization of fabric coloring.

At the same time, based on the coloring method, the color fastness including water fastness, perspiration fastness, rubbing fastness, soaping fastness, dry cleaning fastness, light fastness, etc. of the colored fabric reaches Grade 4 or Grade 4-5, and meet the requirements of GB/T 2660-2017 "Shirt" standard for first-class products and even superior products.

The inventor found through research that the coloring method has good adaptability to base cloth fibers. The base cloth fiber used for coloring can be carbon fibers, polyimide and other synthetic fibers that are difficult to dye in traditional chemical dyes, or can be more common chemical fibers such as polyester, nylon, and spandex, or can be natural fibers, such as traditional cotton, linen, silk and other fibers.

In addition, the coloring method has good adaptability to weaving methods of base cloths, and base cloths obtained by knitting or weaving can perform color generation by the above coloring method and have good color fastness.

Based on the above phenomenon, the inventor has analyzed the reason for its occurrence. The coloring method mainly depends on high energy bonding, which is formed by the color-generating film layer and the base cloth with the assistance of high energy ions, while such bonding is mainly affected by the surface energy of the base cloth and the degree of migration of atoms in the adhesive layer, and is not sensitive to the fiber type and weaving method of the base cloth. Therefore, the coloring method is applicable to base cloths with different fibers and base cloths of different weaving methods.

It is not difficult to understand that the coloring method provided by the embodiments of the present disclosure, the coloring equipment matched with the coloring method also have extremely high universality. There is no need to design corresponding coloring equipment for the base cloth of different weaving methods, which further improves the industrial operability.

According to the technical solution of the embodiments of the present disclosure, the adhesive layer is used to improve the adhesion between the surface of the base cloth and the color-generating layer. Specially, elements such as Ti, Cr, Si, Ni, etc., which have good diffusion performances, can generally be selected for the adhesive layer. In specific implementations of the embodiments of the present disclosure, one of the following four ways can be selected for the adhesive layer:

1. The adhesive layer is an elementary substance layer of Ti, Cr, Si or Ni, that is, the adhesive layer is formed by depositing Ti element, Cr element, Si element or Ni element on the surface of the base cloth. For example, magnetron sputtering technology and titanium target are used to deposit in argon atmosphere, thus forming an elementary metal Ti layer on the surface of the base cloth;

2. The adhesive layer is an oxide layer of Ti, Cr, Si or Ni. That is, titanium oxide, chromium oxide (chromium trioxide), silicon oxide or nickel oxide are deposited on the surface of the base cloth to form an adhesive layer. For example, magnetron sputtering technology and titanium target are used, and oxygen is continuously introduced into the coating chamber at the same time, so that a titanium oxide layer is formed on the surface of the base cloth;

3. The adhesive layer is a nitride layer of Ti, Cr, Si or Ni. That is, titanium nitride, chromium nitride, silicon nitride or nickel nitride are deposited on the surface of the base cloth to form an adhesive layer. For example, magnetron sputtering technology and titanium target are used, and nitrogen is continuously introduced into the coating chamber at the same time, so that a titanium nitride layer is formed on the surface of the base cloth;

4. The adhesive layer is an alloy layer containing at least one of Ti, Cr, Si and Ni For example, magnetron sputtering technology is used, and 316 stainless steel (wherein the mass content of Cr is 16.0%-18.5%, the mass content of Ni is 10.0-14.0%, and the mass content of Si is less than or equal to 1.0%) is used as the target.

In the embodiments of the present disclosure, the color-generating layer can be formed on the surface of the adhesive layer, or more than two successively superimposed color-generating layers can be formed on the surface of the adhesive layer. For example, there are four color-generating layers on the surface of the adhesive layer, which are an elementary metal magnesium layer, an elementary metal aluminum layer, an elementary metal copper layer and a copper nitride layer from inside to outside.

Especially, when there are more than two color-generating layers on the surface of the adhesive layer, the compositions of two adjacent color-generating layers are preferably different.

The above-mentioned case that the compositions of two adjacent color-generating layers are preferably different refers to that the compositions of the two color-generating layers are different or are not completely the same, including cases:

1. The elemental compositions forming the color-generating layers are different, for example, the elements in the two layers are Ag and Ti respectively.

2. The elements forming the color-generating layer exist in different forms, for example, the two layers contain elementary substances, oxides, nitrides or alloys of the same elements (the two layers containing Ti and $TiO_2$ are regarded as having different compositions).

The composition of the above layers can be realized by controlling the vacuum deposition process. For example, in the above case 1, different targets can be selected, for example, a silver target is first selected to form an elementary metal silver layer, and then a titanium target is selected to form an elementary metal titanium layer. In case 2, the same target is selected but different gases are introduced. For example, titanium target is selected for both two vacuum deposition processes, but argon is introduced into the coating chamber for the first vacuum deposition process to form an elementary metal titanium layer, and oxygen is introduced into the coating chamber for the second vacuum deposition process to form a titanium dioxide layer.

Specifically, one of the following three ways can be selected for each color-generating layer:

1. The color-generating layer is an elementary substance layer of Al, Ti, Cu, Fe, Mo, Zn, Ag, Au or Mg;

2. The color-generating layer is an oxide layer, a nitride layer or a carbide layer of Al, Ti, Cu, Fe, Mo, Zn, Ag, Au or Mg;

3. The color-generating layer is an alloy layer containing at least one element among Al, Ti, Cu, Fe, Mo, Zn, Ag, Au and Mg.

The inventor has found through research that, with other conditions unchanged, simply increasing the thickness of one color-generating layer, the final color of the colored fabric will change accordingly. However, when the thickness of the color-generating layer reaches a certain critical value, the waveband reflected by the final colored fabric basically does not change. Generally, the thickness of each color-generating layer is controlled to be 1 nm to 200 nm.

An outermost color-generating layer can also protect and isolate the whole color-generating film layer, so as to avoid the influence of oxygen, water, acid or alkali in the environment on the color-generating film layer, thus improving the durability of colored fabrics. Therefore, materials with good wear resistance, oxidation resistance or acid and alkali resistance are generally selected for the outermost color-generating layer, which generally contains at least one of Ti, Zn, Fe and Cu, and the specific elemental composition of the outermost color-generating layer can be reasonably selected according to the actual demand for fabric products.

Specifically, one of the following two ways can be selected for the outermost color-generating layer:

1. The outermost color-generating layer is an oxide layer or nitride layer of Ti, Zn, Fe or Cu. For example, a copper oxide layer or a copper nitride layer is used as the outermost color-generating layer. In the actual vacuum deposition process, a copper target is selected and oxygen or nitrogen is introduced into the coating chamber.

2. The outermost color-generating layer is an alloy layer containing at least one element of Ti, Zn, Fe and Cu. For example, in the vacuum deposition process, titanium-zinc alloy is used as a target.

Understandably, all of changing a total number of layers and the elemental composition, thickness and setting order of each layer in the color-generating layer will make the final colored fabric show different colors. Because the range of materials selected for the colored layers is very wide, the setting method and setting order of each color-generating layer are also more flexible, so that more colors are possible for the colored fabric.

At the same time, because the color of colored fabric can be realized by adjusting the one or more factors mentioned above, the dependence of color on the thickness of color film layer is reduced. Therefore, the yield and industrial operability are greatly improved.

Of course, in some special cases, some materials can be used as both the adhesive layer and the color-generating layer. For example, a titanium nitride layer or a titanium dioxide layer can be vacuum deposited on the surface of the base cloth, to make the colored fabric present beautiful colors or preset and desired colors.

In addition, as the materials used in the embodiments of the present disclosure can be selected in a wider range, colored fabrics can also have some performances that traditional fabrics do not have. For example, because the optional materials are mainly metals, metal oxides, metal nitrides and alloys, the resistivity of colored fabrics can be reduced, which is beneficial to obtain fabric products with antistatic performances, that is, antistatic fabrics; or, if Ag is used in the color-generating layer, the antibacterial performance can be available for the fabric products; or, by changing the selected materials, the setting mode and setting thickness of the color-generating film layers and other factors, the reflected light waveband of the fabric can be adjusted, so that an anti-ultraviolet fabric or anti-infrared fabric can also be obtained. Therefore, the coloring method provided by the embodiments of the present disclosure can be used to process and prepare some fabric products with special requirements.

Moreover, because the coloring method provided by the embodiments of the present disclosure makes the colored fabric have extremely high color fastness, correspondingly, the antistatic performance and other related performances of the colored fabric are also superior to those of the colored fabric obtained by the conventional vacuum deposition method.

At the same time, materials used to form both the adhesive layer and the color-generating layer are not radioactive and toxic, thus ensuring the safety of the colored fabric.

The embodiments of the present disclosure do not particularly limit the formation ways of the adhesive layer and the color-generating layer, and suitable vacuum deposition ways can be reasonably selected according to factors such as selected materials and film thickness, including but not limited to atomic layer deposition, vapor deposition, magnetron sputtering, and the like. In the specific implementations of the present disclosure, magnetron sputtering is adopted to form the adhesive layer and at least one color-generating layer on the surface of the base cloth.

Specifically, the compositions of the adhesive layer and color-generating layer are controlled by the selection of target and the gas (such as oxygen, nitrogen and argon) introduced into the coating chamber (working chamber). The thicknesses of the adhesive layer and the color-generating layer are controlled by controlling the power, target-to-substrate distance, vehicle speed, gas flow and other conditions in the magnetron sputtering process. In addition, the thickness of the color-generating film layer can be adjusted by controlling the change of instantaneous power, so that different positions of the same fabric have different colors, thus making the fabric have richer gradient colors.

In the specific implementation of the present disclosure, the power in magnetron sputtering process can be reasonably set according to the target used; generally, the target-to-substrate distance is 2 cm-20 cm, the vehicle speed is 0.5 m/min-10 m/min, the background vacuum (base vacuum) is less than or equal to $4.0\times10^{-3}$ Pa, and the working vacuum is less than or equal to $2.0\times10^{-1}$ Pa. If magnetron sputtering is completed under the above conditions, a colored fabric with good performance can be obtained.

The above vehicle speed refers to a moving speed of the base cloth, which is one of the factors affecting the deposition thickness. Understandably, reasonable control of the vehicle speed (generally 0.5 m to 5 m/min) can also make the thickness of the deposited film more uniform, which can not only realize the continuous production of fabric coloring and ensure the yield, but also ensure the uniform thickness of the film and make the color of the finally colored fabric more uniform.

The inventor has conducted research and analysis on the limitation that the existing vacuum deposition technology to achieve fabric coloring is limited to a few special fibers such as polyimide and carbon fiber, but is not applicable to traditional fibers, and believes that the reason is that, the water content of the above special fibers is low, but for the traditional plant fibers such as cotton and hemp, and synthetic fibers such as polyester and spandex, during the vacuum deposition process, the gas inside the base cloth escapes under the bombardment of high-energy particles, to form a gas layer, hinders the film deposition, and finally leads to poor color fastness.

Based on the above findings and analysis, the inventor has tried a variety of drying processes, trying to completely remove water vapor and ammonia from the base cloth. For example, the hot air drying process in traditional dyeing and finishing industry is applied, or the dehydration process in glass and PE coating is applied. However, the coloring mechanism of traditional dyeing and finishing industry is completely different from that of vacuum deposition. In the traditional dyeing and finishing industry, hot air is used to dry the base cloth, which aims to improve the strength and bulkiness of the yarn, but has no obvious benefit to the color fastness of the fabric. For matrix materials such as glass and PE which do not contain moisture and gas inside, there is no gas layer formed by moisture and escaped gas in the coating process. Moreover, isopropyl alcohol dehydration process, which is commonly used in glass coating, will also cause great damage to fabrics. Upon the ordinary heating and drying treatment, the color fastness of colored fabrics still cannot meet the standard requirements.

Radiation drying is a new drying technology in the field of agricultural production, which uses electromagnetic waves such as infrared rays and microwaves as heat sources to transfer heat to materials to be dried by radiation. The inventor has introduced the radiation drying technology into the field of fabric coloring, which effectively removes the moisture and gas (such as ammonia) in the base cloth, thus avoiding the influence of the gas layer formed by the release of vapor or ammonia in the fiber on the color fastness of the colored fabric in the subsequent vacuum deposition process, making the color fastness of the colored fabric meet the requirements of relevant standards, and making the coloring technology have good adaptability to various fibers.

The above-mentioned radiation drying can specifically be infrared radiation drying, such as irradiating the base cloth with infrared radiation lamps or infrared radiation lamp groups, or be microwave drying. In the specific implementation of the present disclosure, the microwave drying is adopted, with the microwave frequency of 2.45 GHz±25 MHz, and the drying temperature not exceeding 200° C. Microwave drying can be done in atmospheric environment (normal pressure environment) or vacuum environment.

It can be understood that the microwave drying temperature should be slightly lower than the tolerance temperature T of the fabric, for example, lower than the tolerance temperature (T-10)° C. of the fabric, so as to avoid fiber embrittlement. Corresponding drying temperatures can be set reasonably for different base cloths.

In addition, compared with traditional drying methods such as hot air drying or electric heating drying, microwave drying has the advantages of short time, low energy consumption, no pollution, uniform drying, etc., and will not damage fibers.

Furthermore, before the vacuum deposition, the base cloth after radiation drying can also be subjected to vacuum heating treatment, and the heating temperature is generally controlled at 60° C. to 120° C., and the pressure is less than $3.0 \times 10^{-3}$ Pa. By performing the vacuum heating treatment, water and gas, especially the moisture and gas on the surface, can be further removed, and the fabric can be prevented from regaining moisture, so that the base cloth has better adhesion with the adhesive layer and the color-generating layer.

Generally, in the process of drying and heating the base cloth, the moving speed of the base cloth can be controlled to be the same as the vehicle speed in the subsequent vacuum deposition process, so as to realize the continuous and smooth production of the whole coloring process.

Specifically, the fabric coloring process can be completed on a vacuum deposition production line. According to the sequence of production flow, the production line includes an unwinding chamber, a radiation drying chamber, a vacuum heating chamber, one or more coating chambers (working chambers) connected in series and a winding chamber. In addition, the production line further includes a transmission device, which can adopt the transmission device used in the traditional dyeing and finishing process, or the transmission device can be adaptively adjusted based on the actual conditions of the unwinding chamber, the coating chamber and the winding chamber.

Where the function of the unwinding chamber is to store all kinds of flexible base cloths in it, and to start, under the action of the guide roller, a transporting belt to transport the base cloths to the coating chamber at the back; the unwinding chamber can be a normal pressure environment or a vacuum environment.

The radiation drying chamber is used to carry out radiation drying treatment, and is provided with an infrared radiation device or a microwave radiation device inside. In the specific implementation of the present disclosure, a microwave radiation device is usually used, the microwave frequency is generally selected to be 2.45 GHz±25 MHz, and the drying temperature is not greater than 200° C. The radiation drying chamber can be directly communicated with the atmosphere, or it can be equipped with vacuum equipment to achieve a vacuum environment.

The vacuum heating chamber is used to perform vacuum heating treatment on the radiation-dried base cloth. Generally, heating equipment such as baking units and vacuum equipment are provided in the vacuum heating chamber to maintain the temperature in the vacuum heating chamber at 60° C. to 120° C. The vacuum degree is less than $3.0 \times 10^{-3}$ Pa.

The function of the coating chamber is to form the adhesive layer and the coloring layer on the surface of the base cloth, and to install, according to requirements of the coating process, corresponding targets in each coating chamber. Generally, each coating chamber is provided with an independent gas path for introducing reactive gases such as oxygen and nitrogen, or introducing protective gases such as argon.

The base cloth that has completed the vacuum deposition process enters the winding chamber from the coating chamber, and is wound with the rotation of the guide roller, thereby completing the entire coloring process.

What needs special explanation is that, when vacuum deposition is carried out in the coating chamber, since the purity of the target used cannot reach 100%, which is generally 99.99%, the embodiments of the present disclosure ignore the inevitable impurities in the target. For example, if the target used is a titanium target and the gas introduced into the coating chamber is argon, it is considered that an elementary metal titanium layer is formed by vacuum deposition.

Furthermore, a mask transmission device can also be arranged on the vacuum deposition production line, so as to realize printing synchronously while the fabric is colored, and further improve the efficiency of fabric coloring.

Furthermore, before the base cloth is sent to the vacuum deposition production line, surface pretreatment, specifically cleaning treatment, can be carried out on the base cloth to remove stains, oil stains and other impurities on the base cloth.

According to the coloring method provided by the embodiments of the present disclosure, the base cloth is not required to meet the requirements on capillary effect, whiteness, pH value, glossiness, etc. in the traditional dyeing process, so there is no need to carry out corresponding pretreatment procedures to meet the above requirements. Furthermore, refining and mercerizing are not required in the pre-finishing part, so that procedures for pretreatment and the resulting problems of energy consumption, water consumption, chemical materials consumption and wastewater are greatly reduced.

The colored fabric obtained from the vacuum deposition production line can be further subjected to post-finishing treatment, which mainly uses physical finishing to further realize softness of clothing and clothing fabrics. This process can refer to the post-finishing process of traditional dyeing and finishing process, and will not be repeated.

The embodiments of the present disclosure also provide a colored fabric, which is obtained by coloring the surface of the base cloth using the above coloring method.

The base cloth used for coloring can be natural fibers such as cotton and hemp, or be synthetic fibers such as polyester and spandex, which is not particularly limited in the embodiments of the present disclosure. Especially, the base cloth can also be high-performance fibers such as carbon fiber, polyimide and glass fibers which are difficult to be colored with traditional chemical dyes.

The weaving method of the above base cloth can be knitting, weaving or other weaving methods, which is not particularly limited in the embodiments of the present disclosure either.

As described above, the colored fabric prepared by the coloring method provided by the embodiments of the present disclosure can have richer colors and better color fastness, and can be mass-produced through industrialization.

At the same time, the colored fabric has equivalent air permeability and moisture permeability as ordinary fabrics, and can also have the characteristics that traditional fabrics do not have, such as antistatic performance, ultraviolet radiation protection, waterproof performance and antibacterial performance, so that it has a wider range of application prospect.

The fabric coloring method provided by the embodiments of the disclosure has following advantages:

1. By adopting vacuum deposition technology, an adhesive layer and a color-generating layer are formed on the surface of the base cloth; by utilizing the absorption, refraction and reflection effects of light by different materials and nanofilm layers of different thicknesses, the coloring effect of fabrics can be achieved. In addition, by selecting different materials, changing the setting scheme of each film layer and thickness of each film layer, the fabric presents different colors, thus greatly improving the richness of colors.

2. For this coloring method, since the adjustment and change of fabric color can be realized through the selection of materials or the setting scheme of film layer, the sensitivity and dependence of color on film thickness are greatly reduced, thus improving the industrial operability and implementability.

3. This coloring technology can make colored fabrics have extremely good color fastness, including water fastness (GB/T 5713-2013), perspiration fastness (GB/T 3922-2013), and rubbing fastness (GB/T 3920-2008), soaping fastness (GB/T 3921-2008), dry cleaning fastness (GB/T 5711-1997), light fastness (GB/T 8427-2008), all of which have reached Grade 4 or Grade 4-5 and meet the requirements of GB/T 2660-2017 "Shirt" standard for first-class products.

4. This coloring technology has strong universality and can be applied to special fiber fabrics including high-performance fibers that cannot be colored by traditional dyes, as well as traditional natural fiber and synthetic fiber fabrics, without designing different coloring schemes for different fabrics; at the same time, the coloring technology also has strong universality for different weaving methods, so there is no need to design matching equipment for different weaving methods, which further improves industrial operability and implementability.

5. Using this coloring technology, the resulting dyed fabric has equivalent air permeability and moisture permeability as ordinary fabric. Based on materials used in the coloring technology, the colored fabric may have unique performances that traditional fabrics do not have, such as:

(1) Since this coloring technology uses a film layer to generate color, the wrapping performance of the film layer on the fabric fibers can greatly reduce the tip discharge effect of the fabric, and the conductive effect of the metal layer in the film layer can further reduce the static electricity of the fabric. Therefore, the coloring technology can improve the anti-static effect of fabric, and can also play the role of electromagnetic shielding.

(2) Upon reasonable design, the color-generating film layer of this technology can strengthen the absorption and reflection of the ultraviolet or infrared region of light waves, and play a role of sun protection or a certain degree of infrared shielding.

(3) The compactness and hydrophobic effect of the surface layer of the color-generating film layer may make the fabric have a good waterproof performance.

6. In the entire coloring process, the application of a mask that runs synchronously with the cloth can realize printing and dyeing simultaneously, which greatly reduces the production process.

7. This coloring technology does not require the base cloth to meet the requirements of the traditional dyeing process on capillary effect, whiteness, pH value, glossiness, etc., and the pretreatment process requires only oil removal, desizing and cleaning, instead of refining and mercerizing, which greatly reduces procedures of the pretreatment and the resulting problems of energy consumption, water consumption, chemical materials consumption and wastewater.

8. The whole coloring process does not use water and chemical materials. Compared with the traditional dyeing technology, it greatly saves water resources, and no waste liquid, sludge and toxic gas are discharged during production, so it has the advantage of environmental protection.

The colored fabric provided by the embodiments of the present disclosure has richer colors and can be manufactured industrially.

In addition, the colored fabric has air permeability and moisture permeability which are basically equivalent to those of ordinary fabrics, so it can meet the application scenarios of current traditional fabrics. At the same time, the colored fabric can also have features that the traditional fabrics do not have, such as antistatic performance, anti-ultraviolet radiation, waterproof performance and antibacterial performance, so it has a wider application prospect.

DESCRIPTION OF EMBODIMENTS

Figure 1:
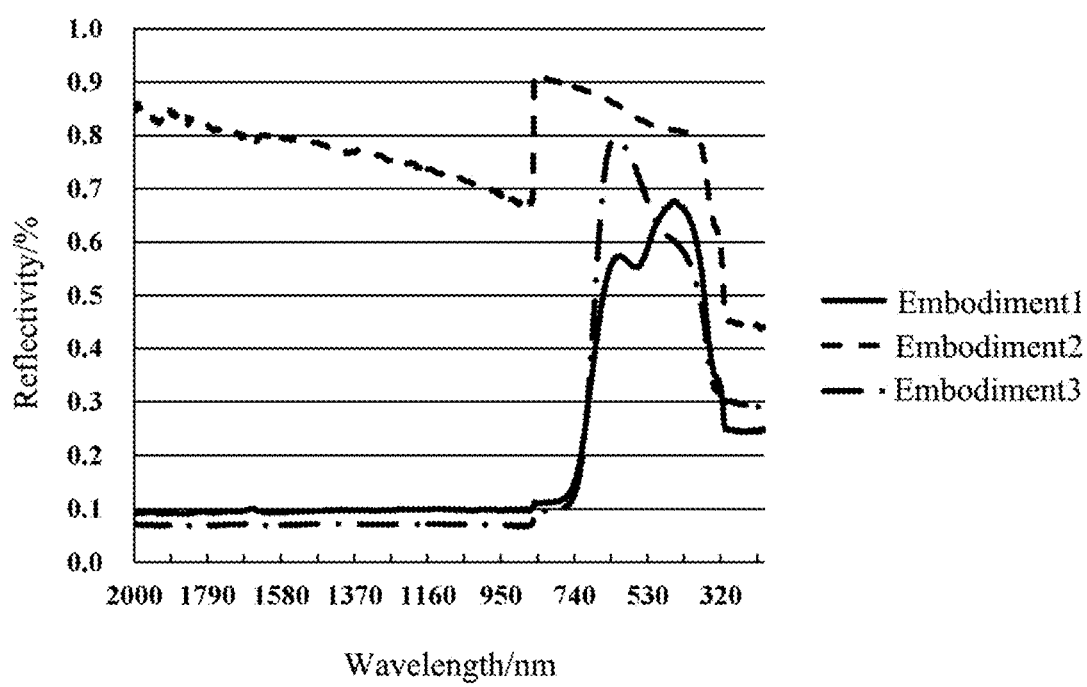
FIG. 1 is a light reflection spectrum of the colored fabric provided by Embodiments 1-3 of the present disclosure.

In order to make the objectives, technical solutions and advantages of the embodiments of the present disclosure clearer, the technical solutions in the embodiments of the present disclosure will be described clearly and completely below. Obviously, the described embodiments are part of the embodiments of the present disclosure.

In the following embodiments, the process of coloring the fabric roughly includes: pretreatment (surface cleaning), radiation drying treatment, vacuum heating, vacuum deposition, post-finishing, testing, detection and finished products, where:

specifically, pretreatment is cleaning the base cloth with deionized water, and then performing preliminary drying to ensure that the surface of the base cloth is clean.

Radiation drying, vacuum heating and vacuum deposition are completed on the vacuum deposition production line. According to the sequence of the production process, the production line includes an unwinding chamber, a radiation drying chamber, a vacuum heating chamber, one or more coating chambers (working chambers) and a winding chamber. In addition, the production line also includes a transmission device, which adopts a transmission device used in traditional dyeing and finishing industry, so that the base cloth or colored fabric semi-finished product can reach the winding chamber from the unwinding chamber through the radiation drying chamber, the vacuum heating chamber and the coating chamber one by one.

The rolled base cloth is first subjected to radiation drying treatment to remove moisture and gas in the base cloth, and then passes through a vacuum heating chamber to remove moisture and gas on the surface of the base cloth. After the above two heating treatments, the base cloth has better adhesion with the adhesive layer and the color-generating layer.

According to actual needs, each coating chamber (working chamber) is provided with one or more targets. During the magnetron sputtering process, corresponding films are formed on the surface of the base cloth in sequence according to the target number. For example, there are four types of targets provided in a coating chamber, which are marked as target 1, target 2, target 3 and target 4. In this way, magnetron sputtering can be performed in sequence in the above order to obtain 4 layers of films.

Post-finishing can be reasonably selected according to the actual situation of colored fabrics, mainly for fabrics used in clothing and clothing fabrics. For example, physical finishing is used to achieve its softness. For other kinds of colored fabrics, if there is no special requirement, no post-finishing is required.

After post-finishing, and then a series of subsequent tests and detections on the colored fabric, the whole production process is completed and the final product is obtained.

Embodiment 1

This embodiment provides a fabric coloring method, the base cloth used in which is a polyester-cotton blended fabric and the weaving method is knitting. The specific processing technology of the method is shown in Table 1 below.

After the above processing, the finally obtained colored fabric is uniformly yellow-green, and its reflection spectrum in the wavelength range from 200 nm to 2000 nm is shown in FIG. 1.

Figure 2:
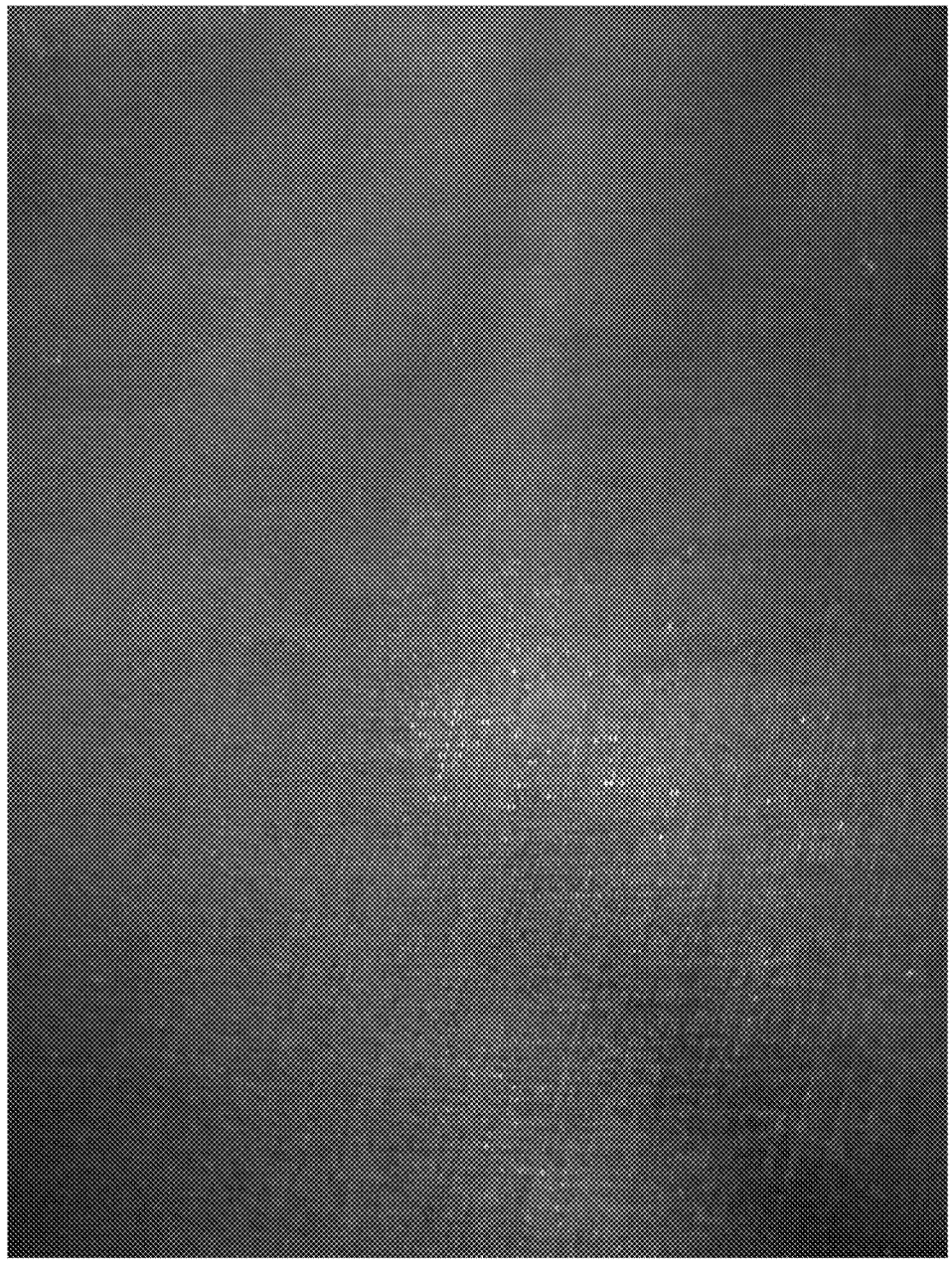
FIG. 2 is a photograph of the surface of the colored fabric provided by Embodiment 1 of the present disclosure.

FIG. 2 is a photograph of the surface of the colored fabric. According to FIG. 2, a very uniform film layer is deposited on the surface of the colored fabric; it can also be observed by naked eyes that a film layer is deposited on the whole surface of the colored fabric, and there is no problem of uneven coloring.

Color fastness test is performed on the colored fabric of this embodiment and the result shows that all color fastnesses, including water fastness (GB/T 5713-2013), perspiration fastness (GB/T 3922-2013), rubbing fastness (GB/T 3920-2008), soaping fastness (GB/T 3921-2008), fry cleaning fastness (GB/T 5711-1997), light fastness (GB/T 8427-2008), have reached Grade 4 or Grade 4-5, which meet the requirements of GB/T 2660-2017 "Shirt" standard for first-class products.

TABLE 1

| | | Pretreatment | Cleaning with deionized water to ensure clean surface and then performing preliminary drying |
|---|---|---|---|
| Film coloring | Radiation drying chamber | Microwave frequency (Hz) | 2.45G |
| | | Drying temperature (° C.) | 80 |
| | | Pressure (Pa) | 1.01E+05 |
| | Vacuum heating chamber | Vacuum degree (Pa) | 2.40E−03 |
| | | Drying temperature (° C.) | 80 |
| | Working chamber 1 | Background vacuum (Pa) | 3.00E−03 |
| | | Working vacuum (Pa) | 1.80E−02 |
| | | Target 1 (power W) | Ti (6300W) |
| | | Ar flow (sccm) | 450 |
| | Working chamber 2 | Background vacuum (Pa) | 3.80E−03 |
| | | Working vacuum (Pa) | 2.40E−02 |
| | | Target 1 (power W) | Ti-Zn alloy (3500W) |
| | | Target 2 (power W) | Ti-Zn alloy (3500W) |
| | | Target 3 (power W) | Ag (700W) |

TABLE 1-continued

| | Pretreatment | Cleaning with deionized water to ensure clean surface and then performing preliminary drying |
|---|---|---|
| Working chamber 3 | Target 4 (power W) | Ti (200W) |
| | Ar flow (sccm) | 500 |
| | Background vacuum (Pa) | 3.40E−03 |
| | Working vacuum (Pa) | 1.40E−02 |
| | Target 1 (power W) | Ti (5000W) |
| | Ar flow (sccm) | 500 |
| | $N_2$ flow (sccm) | 400 |
| Winding chamber | Vacuum degree (Pa) | 1.80E−02 |
| | Vehicle speed (m/min) | 3 |
| Post-finishing | | Softening |

Comparative Example 1

This Comparative Example provides a fabric coloring method, and the base cloth used in this Comparative Example is exactly the same as that of Embodiment 1. The only difference between this Comparative Example and Embodiment 1 is that the base cloth is not subjected to microwave drying.

Figure 3:
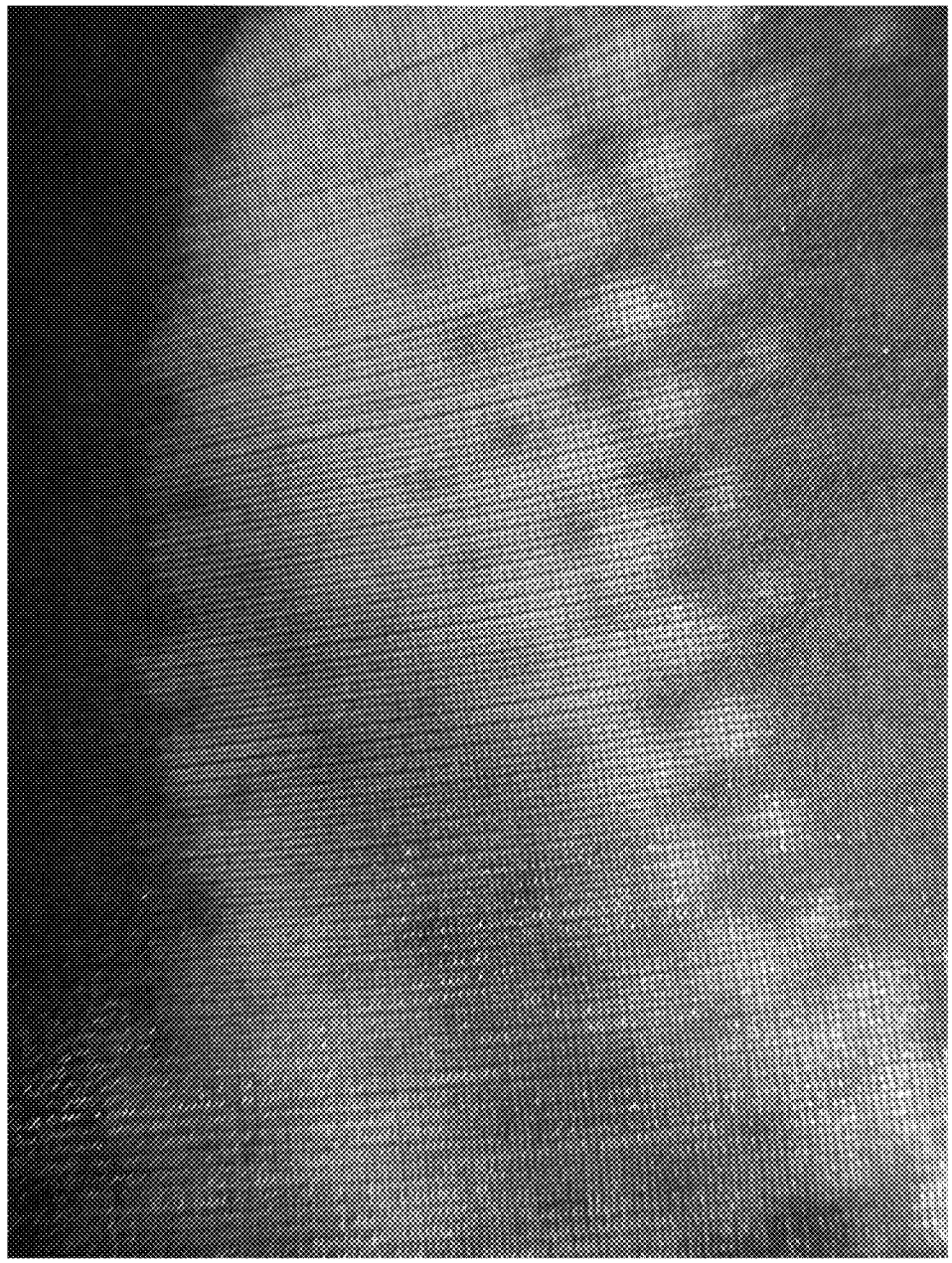
FIG. 3 a photograph of the surface of the colored fabric provided by Comparative Example 1 of the present disclosure.

After the above processing, part of the colored fabric finally obtained is yellow green. FIG. 3 is a photograph of the surface of the colored fabric. As can be seen from FIG. 3, part of the colored fabric has no film layer deposited and shows the color of the base cloth itself, and the film layer on the surface of the fabric is uneven.

Color fastness test is performed on the area where the film layer is deposited and the result shows that its color fastness is only Grade 1-2, which does not meet requirements of GB/T 2660-2017 "Shirt" standard for qualified products (Grade 3 is qualified).

It can be seen from Embodiment 1 and Comparative Example 1, by performing microwave drying on the base cloth, the film layer deposited on the surface of the base cloth is more uniform and the color fastness is greatly improved.

Embodiment 2

This embodiment provides a fabric coloring method. The base cloth used in this embodiment is polyester and the weaving method is weaving. The specific processing technology of the method is shown in Table 2 below.

After the above processing, the finally obtained colored fabric is brow-red, and its reflection spectrum in the wavelength range from 200 nm to 2000 nm is shown in FIG. 1.

Color fastness test is performed on the colored fabric of this embodiment and the result shows that all the color fastnesses, including water fastness (GB/T 5713-2013), perspiration fastness (GB/T 3922-2013), rubbing fastness (GB/T 3920-2008), soaping fastness (GB/T 3921-2008), dry cleaning fastness (GB/T 5711-1997), light fastness (GB/T 8427-2008), have reached Grade 4 or Grade 4-5, which meet the requirements of GB/T 2660-2017 "Shirt" standard for first-class products.

The colored fabric was tested for UV resistance, air permeability, surface water repellency, water permeability, etc., a brown-red fabric obtained by traditional dyeing method was used as a control, and related test items and test results thereof are shown in Table 3 below.

The surface water repellency test is to take three parallel fabric samples for testing, denoted respectively as sample 1 #, sample 2 # and sample 3 #.

According to the test comparison results in Table 3, in terms of UV resistance, water repellency and water resistance, the colored fabric of this embodiment is obviously better than the cloth obtained by the traditional dyeing method; while in terms of air permeability and moisture permeability, test results of the two are substantially equivalent.

Therefore, the coloring method of this embodiment does not affect the air permeability and moisture permeability of the final colored fabric, but makes the colored fabric have more unique performances instead, such as UV resistance, water repellency and water resistance.

TABLE 2

| | Pretreatment | | Cleaning with deionized water to ensure clean surface and then performing preliminary drying |
|---|---|---|---|
| Film layer coloring | Radiation drying chamber | Microwave frequency (Hz) | 2.45G |
| | | Drying temperature (° C.) | 120 |
| | | Pressure (Pa) | 1.01E+05 |
| | Vacuum heating chamber | Vacuum degree (Pa) | 2.40E−03 |
| | | Drying temperature (° C.) | 120 |
| Film layer coloring | Working chamber 1 | Background vacuum (Pa) | 3.80E−03 |
| | | Working vacuum (Pa) | 1.80E−01 |
| | | Target (power W) | Ti (800W) |
| | | Ar flow (sccm) | 430 |
| | | $O_2$ flow (sccm) | 350 |
| | Working chamber 2 | Background vacuum (Pa) | 4.0E−03 |
| | | Working vacuum (Pa) | 1.7E−01 |
| | | Target 1 (power W) | Cu-Zn alloy (2500W) |
| | | Target 2 (power W) | Cu (800W) |
| | | Ar flow (sccm) | 500 |

TABLE 2-continued

| Pretreatment | | Cleaning with deionized water to ensure clean surface and then performing preliminary drying |
|---|---|---|
| Working chamber 3 | Background vacuum (Pa) | 1.20E−03 |
| | Working vacuum (Pa) | 1.0E−01 |
| | Target 1 (power W) | Cu (1800W) |
| | Ar flow (sccm) | 430 |
| | $O_2$ flow (sccm) | 250 |
| Working chamber 4 | Background vacuum (Pa) | 1.40E−03 |
| | Working vacuum (Pa) | 1.40E−01 |
| | Target 1 (power W) | Ti (5000W) |
| | Ar flow (sccm) | 500 |
| | $N_2$ flow (sccm) | 400 |
| Winding chamber | Vacuum degree (Pa) | 1.80E−02 |
| | Vehicle speed (m/min) | 1 |
| Post-finishing | | Softening |

TABLE 3

| | | Test items | Test results | |
|---|---|---|---|---|
| The colored fabric of this embodiment | Before cleaning | UV protection factor (UPF) | >50 | |
| | Before cleaning | UV transmittance, T(UVB)AV | 0.1 | % |
| | Before cleaning | UV transmittance, T(UVA)AV | 0.52 | % |
| | Before cleaning | UV protection factor, UPF(AV) | 658.21 | |
| | Air permeability | | 37.01 | mm/s |
| | Surface water repellency | Sample 1# | 4-5 | Grade |
| | Surface water repellency | Sample 2# | 4-5 | Grade |
| | Surface water repellency | Sample 3# | 4-5 | Grade |
| | Hydrostatic pressure | | 2.5 | kPa |
| | Moisture permeability | Moisture permeability Degree | 0.048 | g/($m^2$ · Pa · h) |
| | Moisture permeability | Moisture permeability rate | 3.82E+03 | g/($m^2$ * 24 h) |
| | Moisture permeability | Moisture permeability coefficient | 1.50E−11 | g · cm/($cm^2$ · s · Pa) |
| Comparative fabric | Before cleaning | UV protection factor (UPF) | 45 | |
| | Before cleaning | UV transmittance, T(UVB)AV | 0.62 | % |
| | Before cleaning | UV transmittance, T(UVA)AV | 13.81 | % |
| | Before cleaning | UV protection factor, UPF(AV) | 46.01 | |
| | Air permeability | | 35.01 | mm/s |
| | Surface water repellency | Sample 1# | 0 | Grade |
| | Surface water repellency | Sample 2# | 0 | Grade |
| | Surface water repellency | Sample 3# | 0 | Grade |
| | Hydrostatic pressure | | 0 | kPa |
| | Moisture permeability | Moisture permeability Degree | 0.0455 | g/($m^2$ · Pa · h) |
| | Moisture permeability | Moisture permeability rate | 3.62E+03 | g/($m^2$ * 24 h) |
| | Moisture permeability | Moisture permeability coefficient | 1.40E−11 | g · cm/($cm^2$ · s · Pa) |

Embodiment 3

This embodiment provides a fabric coloring method. The base cloth used in this embodiment is glass fiber and the weaving method is weaving. The specific processing technology is shown in Table 4 below:

TABLE 4

| | Pretreatment | | Cleaning with deionized water to ensure clean surface and then performing preliminary drying |
|---|---|---|---|
| Film layer coloring | Radiation drying chamber | Microwave frequency (Hz) | 2.45G |
| | | Drying temperature (° C.) | 120 |
| | | Pressure (Pa) | 1.01E+05 |
| | Vacuum heating chamber | Vacuum degree (Pa) | 2.70E−03 |
| | | Drying temperature (° C.) | 70 |
| | Working chamber 1 | Background vacuum (Pa) | 3.20E−03 |
| | | Working vacuum (Pa) | 1.0E−02 |
| | | Target 1 (power W) | 316 Stainless steel (2500W) |
| | | Ar flow (sccm) | 450 |
| | Working chamber 2 | Background vacuum (Pa) | 3.80E−03 |
| | | Working vacuum (Pa) | 2.40E−02 |
| | | Target 1 (power W) | Mg (500W) |
| | | Target 2 (power W) | Al (300W) |
| | | Target 3 (power W) | Cu (1000W) |
| | | Ar flow (sccm) | 500 |
| Film coloring | Working chamber 3 | Background vacuum (Pa) | 1.40E−03 |
| | | Working vacuum (Pa) | 1.20E−01 |
| | | Target 1 (power W) | Cu (1000W) |
| | | Target 2 (power W) | Ti (800W) |
| | | Ar flow (sccm) | 500 |
| | | $N_2$ flow (sccm) | 400 |
| | Winding chamber | Vacuum degree (Pa) | 1.50E−01 |
| | Vehicle speed (m/min) | | 2 |
| | Post-finishing | | NO |

After the above processing, the finally obtained colored fabric is blue-green, and its reflection spectrum in the wavelength range from 200 nm to 2000 nm is shown in FIG. 1.

Color fastness test is performed on the colored fabric of this embodiment and the result shows that all the color fastnesses, including water fastness (GB/T 5713-2013), perspiration fastness (GB/T 3922-2013), rubbing fastness (GB/T 3920-2008), soaping fastness (GB/T 3921-2008), dry cleaning fastness (GB/T 5711-1997), light fastness (GB/T 8427-2008), have reached Grade 4 or Grade 4-5, which meet the requirements of GB/T 2660-2017 "Shirt" standard for first-class products.

A series of anti-static performance tests on the colored fabric are performed and two kinds of fabrics are also provided for comparison. The white woven fabric (glass fiber) is used as the comparative fabric 1. The difference between the processing technology of the comparative fabric 2 and the above glass fiber is that the base cloth is not subjected to microwave drying.

The related test items and test results of the above three fabrics are shown in Table 5 below.

TABLE 5

| | Test items | | Test results | |
|---|---|---|---|---|
| Colored fabric in this embodiment | Frictional electrification voltage | The final value of the front | 30 | V |
| | Frictional electrification voltage | The final value of the reverse | 219 | V |
| | Surface resistivity | Final value | 7.10E+09 | Ω |

TABLE 5-continued

| | Test items | | Test results | |
|---|---|---|---|---|
| Comparative fabric 1 | Frictional electrification voltage | The final value of the front | 400 | V |
| | Frictional electrification voltage | The final value of the reverse | 942 | V |
| | Surface resistivity | Final value | 6.50E+11 | Ω |
| Comparative fabric 2 | Frictional electrification voltage | The final value of the front | 7299 | V |
| | Frictional electrification voltage | The final value of the reverse | 8222 | V |
| | Surface resistivity | Final value | 8.70E+13 | Ω |

According to the test results in Table 5, the frictional electrification voltage and surface resistivity of the colored fabric obtained in this embodiment are significantly lower than those of the comparative fabrics. It can be seen that the colored fabric obtained by adopting the coloring method of this embodiment has very outstanding antistatic performance.

It can also be observed with the naked eyes that the film layer deposited on the surface of the colored fabric obtained in this embodiment is very uniform, and the color is relatively uniform; however, there is no film layer deposition in some areas of the comparative fabric 2, and the color difference of different areas is more obvious.

Finally, it should be noted that the above embodiments are only used to illustrate the technical solutions of the present disclosure and do not constitute a limitation thereon. Although the present disclosure has been described in detail with reference to the foregoing embodiments, those of ordinary skill in the art should understand that the technical solutions described in the foregoing embodiments may be modified, or some or all of the technical features may be equivalently replaced; these modifications or replacements do not make the essence of the corresponding technical solutions deviate from the scope of the technical solutions of the embodiments of the present disclosure.

What is claimed is:

1. A fabric coloring method, comprising:

performing a radiation drying treatment on a base cloth, wherein the radiation drying treatment is microwave drying with a microwave frequency controlled at 2.45 GHz+25 MHz and a drying temperature is not greater than 200° C.;

performing a vacuum heating treatment on the base cloth after the radiation drying treatment, the vacuum heating treatment with a pressure controlled at less than $3.0 \times 10^{-3}$ Pa and a heating temperature controlled at 60° C. to 120° C.;

sequentially forming, by magnetron sputtering, an adhesive layer and more than two color-generating layers on a surface of the base cloth after the vacuum heating treatment, wherein the adhesive layer is used to improve adhesion between the surface of the base cloth and the more than two color-generating layers, and compositions of two adjacent color-generating layers are different;

changing a color of colored fabric by controlling a composition, a thickness and a setting order of the adhesive layer and of each of the more than two color-generating layers;

wherein:

the thickness of each of the adhesive layer and the more than two color-generating layers are controlled by controlling a moving speed of the base cloth, a power, a target-to-substrate distance, and a gas flow in the magnetron sputtering; wherein the target-to-substrate distance is controlled as 2 cm to 20 cm; the moving speed of the base cloth is controlled as 0.5 m/min to 5 m/min; a base vacuum is controlled as less than or equal to $4.0 \times 10^{-3}$ Pa; a working vacuum is controlled as less than or equal to $2.0 \times 10^{-1}$ Pa; a power for forming the adhesive layer by the magnetron sputtering is controlled as 800-6300 W; a power for forming the more than two color-generating layers by the magnetron sputtering is controlled as 200-5000 W; a gas flow of Ar for forming the adhesive layer by the magnetron sputtering is controlled as 430-450 sccm; a gas flow of Ar for forming the more than two color-generating layers by the magnetron sputtering is controlled as 430-500 sccm;

a composition of the adhesive layer comprises at least one of Ti, Cr, Si and Ni, and a thickness of the adhesive layer ranges from 1 nm to 2000 nm;

a composition of each of the more than two color-generating layer comprises at least one of Al, Ti, Cu, Fe, Mo, Zn, Ag, Au, and Mg, a thickness of each of the more than two color-generating layers is controlled to be 1 nm to 200 nm, an outermost color-generating layer of the more than two color-generating layers comprises at least one of Ti, Zn, Fe and Cu, and a total thickness of the more than two color-generating layers ranges from more than 2 nm to 4000 nm.

2. The coloring method according to claim 1, wherein the adhesive layer is an elementary substance layer of Ti, Cr, Si or Ni, or an oxide layer or a nitride layer of Ti, Cr, Si or Ni, or an alloy layer containing at least one of Ti, Cr, Si and Ni.

3. The coloring method according to claim 1, wherein each of the more than two color-generating layers is an elementary substance layer of Al, Ti, Cu, Fe, Mo, Zn, Ag, Au or Mg; or each of the more than two color-generating layers is an oxide layer, a nitride layer or a carbide layer of Al, Ti, Cu, Fe, Mo, Zn, Ag, Au or Mg; or each of the more than two color-generating layers is an alloy layer containing at least one element of Al, Ti, Cu, Fe, Mo, Zn, Ag, Au and Mg.

4. The coloring method according to claim 1, further comprising:

performing a pre-treatment on the base cloth, wherein the pre-treatment is a step performed before the radiation drying treatment, and comprises cleaning the base cloth with deionized water, and then performing a preliminary drying treatment to ensure that the surface of the base cloth is clean.

5. A colored fabric, obtained by coloring a base cloth surface through the coloring method according to claim 1.

6. A colored fabric, obtained by coloring a base cloth surface through the coloring method according to claim 2.

7. A colored fabric, obtained by coloring a base cloth surface through the coloring method according to claim 3.

8. A colored fabric, obtained by coloring a base cloth surface through the coloring method according to claim 4.

* * * * *